(12) United States Patent
Satori et al.

(10) Patent No.: US 7,325,104 B2
(45) Date of Patent: Jan. 29, 2008

(54) STORAGE DEVICE USING INTERLEAVED MEMORIES TO CONTROL POWER CONSUMPTION

(75) Inventors: Kenichi Satori, Tokyo (JP); Keiichi Tsutsui, Kanagawa (JP); Kenichi Nakanishi, Tokyo (JP); Hideaki Bando, Tokyo (JP); Hideaki Okubo, Saitama (JP); Yoshitaka Aoki, Kanagawa (JP); Tamaki Konno, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/329,843

(22) Filed: Jan. 11, 2006

(65) Prior Publication Data

US 2006/0184758 A1 Aug. 17, 2006

(30) Foreign Application Priority Data

Jan. 11, 2005 (JP) .......................... P2005-004299

(51) Int. Cl.
*G06F 13/00* (2006.01)

(52) U.S. Cl. .................. 711/150; 711/168; 711/169; 345/537

(58) Field of Classification Search ................ 711/150, 711/167–168, 169; 345/533–535
See application file for complete search history.

(56) References Cited

U.S. PATENT DOCUMENTS

| 5,673,070 | A | * | 9/1997 | Nakanishi et al. ............ 347/19 |
| 6,094,693 | A | * | 7/2000 | Haneda ....................... 710/36 |
| 6,418,535 | B1 | * | 7/2002 | Kulakowski et al. ........ 713/320 |
| 6,823,516 | B1 | * | 11/2004 | Cooper ........................ 718/108 |
| 7,152,136 | B1 | * | 12/2006 | Charagulla ................... 710/315 |
| 2002/0064112 | A1 | * | 5/2002 | Seo .......................... 369/53.18 |
| 2004/0243992 | A1 | * | 12/2004 | Gustafson et al. .......... 717/168 |

* cited by examiner

*Primary Examiner*—Matthew Kim
*Assistant Examiner*—Hetul Patel
(74) *Attorney, Agent, or Firm*—Lerner, David, Littenberg, Krumholz & Mentlik, LLP

(57) ABSTRACT

A storage device includes a plurality of memories storing data; and a controller controlling the memories, the controller performing in parallel in a number of the memories, the number being specified by a supplied specifying signal, one of a data writing process for writing data supplied from a connection destination device to which the storage device is connectable and a data reading process for reading data requested by the connection destination device.

9 Claims, 13 Drawing Sheets

FIG. 3

| | GRADE VALUE [1:0] | DATA TRANSFER RATE (WITH ONE AS DATA TRANSFER RATE OF GRADE 1) | NUMBER OF FLASH MEMORY CHIPS INTERLEAVED | POWER CONSUMPTION (WITH ONE AS POWER CONSUMPTION OF GRADE 1) |
|---|---|---|---|---|
| GRADE 1 | 00 | 1 | N (FOUR IN PRESENT EMBODIMENT) | 1.0 |
| GRADE 2 | 01 | 2 | 2 × N (EIGHT IN PRESENT EMBODIMENT) | 1.5 |
| GRADE 3 | 10 | 4 | 4 × N (16 IN PRESENT EMBODIMENT) | 3.0 |

FIG. 5
GRADE 1 (TRANSFER RATE OF 1)
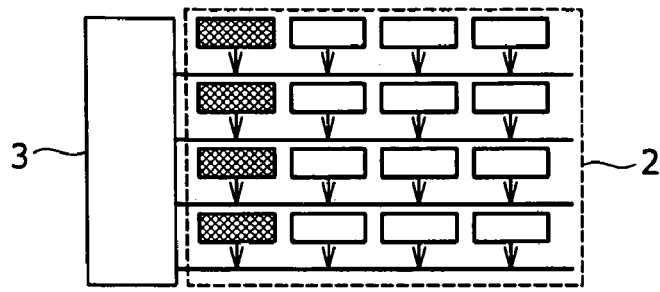
GRADE 2 (TRANSFER RATE OF 2)
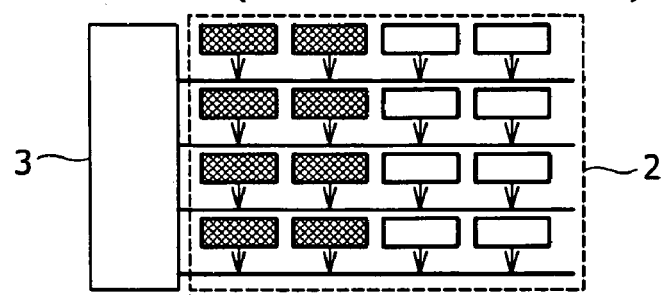
GRADE 3 (TRANSFER RATE OF 4)
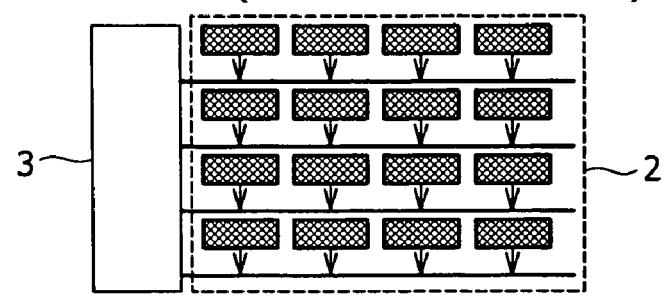
▦ ACTIVATED FLASH MEMORY CHIP CP
☐ INACTIVATED FLASH MEMORY CHIP CP

GRADE 1

GRADE 2

GRADE 3

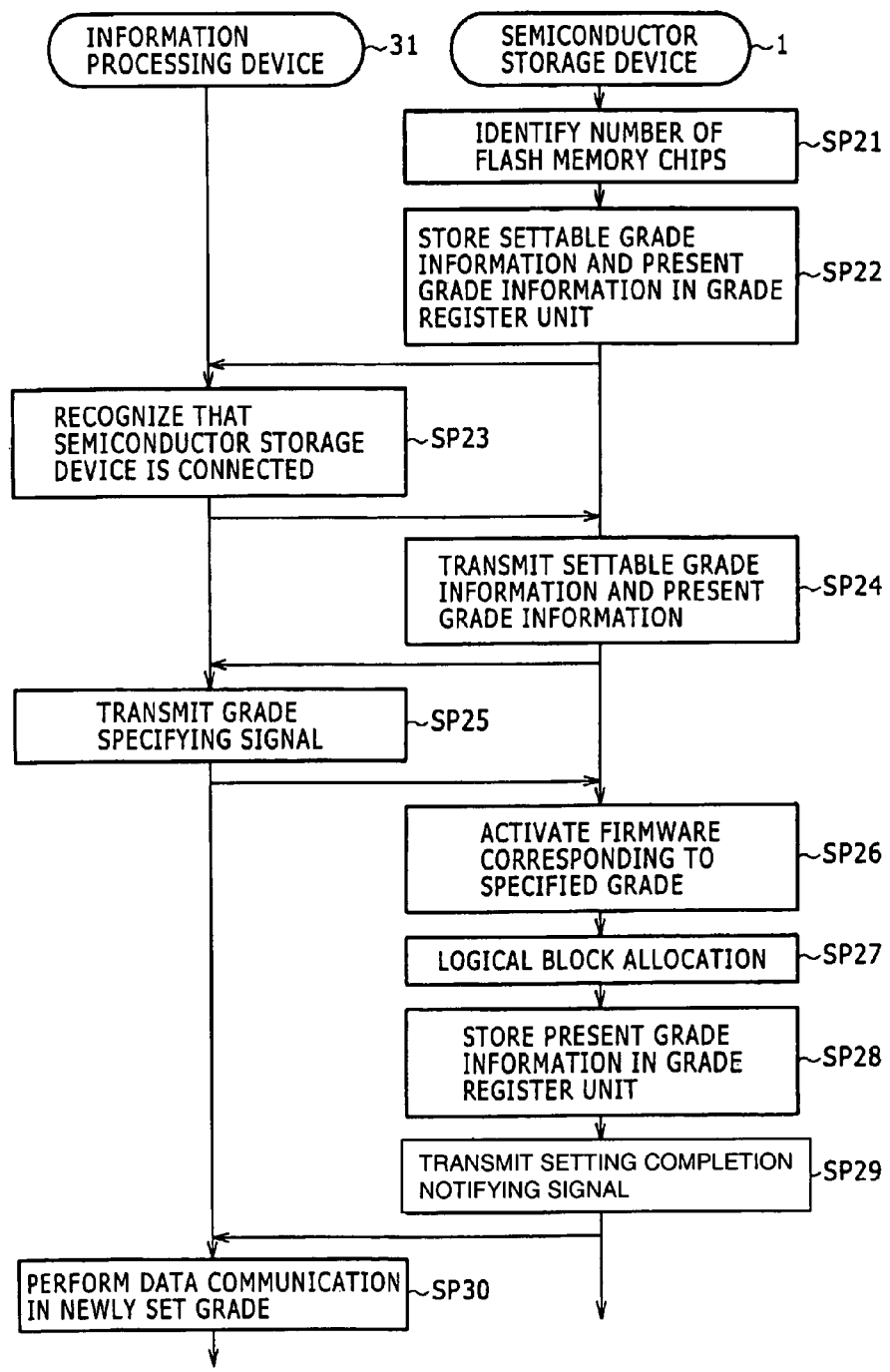

STORAGE DEVICE USING INTERLEAVED MEMORIES TO CONTROL POWER CONSUMPTION

CROSS-REFERENCE TO RELATED APPLICATIONS

The present application claims priority from Japanese Patent Application No. JP 2005-004299 filed on Jan. 11, 2005, the disclosure of which is hereby incorporated by reference herein.

BACKGROUND OF THE INVENTION

The present invention relates to a storage device, and is suitable for application to for example a semiconductor storage device that stores data supplied from an information processing apparatus such as a personal computer, a digital camera or the like in an internal semiconductor memory.

A conventional semiconductor storage device of this type, being connected to an information processing apparatus corresponding to a personal computer, a digital camera or the like, performs a data writing process for writing data supplied from the information processing apparatus to an internal semiconductor memory and a data reading process for reading data requested by the information processing apparatus from the internal semiconductor memory, using power supplied from the information processing apparatus (see U.S. Pat. No. 6,148,354 as Patent Document 1, for example).

When the information processing apparatus to which such a semiconductor storage device is connected corresponds to a digital camera operating on power supplied from a battery provided within the information processing apparatus, for example, an effect of reducing the power consumption of the digital camera and the like can be obtained when the data write processing speed and the data read processing speed of the semiconductor storage device can be decreased to a certain extent.

When the information processing apparatus to which such a semiconductor storage device is connected corresponds to a personal computer operating on power supplied from a commercial power supply within a house, for example, an effect of shortening the processing time of data write processing and data read processing and the like can be obtained when the data write processing speed and the data read processing speed of the semiconductor storage device can be increased.

It is considered that convenience can be greatly improved when the data write processing speed and the data read processing speed of the semiconductor storage device can be thus changed according to a situation in which the semiconductor storage device is used.

Further, when such a semiconductor storage device can guarantee a minimum data write processing speed and a minimum data read processing speed according to a kind of data (moving image data or musical (audio) data) to be read and written, the semiconductor storage device can for example record moving image data without dropping frames and record/reproduce musical (audio) data seamlessly.

The present invention has been made in view of the above points. It is desirable to propose a storage device that can appropriately change data write processing speed and data read processing speed and a storage device that can guarantee a data write processing speed and a data read processing speed.

SUMMARY OF THE INVENTION

In order to solve the above problems, according to an embodiment of the present invention, there is provided a storage device including a plurality of memory means for storing data; and control means for controlling the memory means, the control means performing in parallel in a number of memory means, the number being specified by a supplied specifying signal, one of a data writing process for writing data supplied from a connection destination device to which the storage device is connectable and a data reading process for reading data requested by the connection destination device.

Consequently, this storage device can appropriately change the data write processing speed and data read processing speed by changing the number of memory means specified by the specifying signal.

In addition, according to an embodiment of the present invention, there is provided a storage device including a plurality of memory means for storing data; and control means for controlling the memory means, wherein one of a speed of data write process for writing data supplied from a connection destination device to which the storage device is connectable and a speed of data read process for reading data requested by the connection destination device is guaranteed.

Consequently, since this semiconductor storage device can guarantee a minimum data write processing speed and a minimum data read processing speed, the semiconductor storage device can, for example, record moving image data without dropping frames and record/reproduce musical (audio) data seamlessly.

According to an embodiment of the present invention, it is possible to appropriately change the data write processing speed and data read processing speed by changing the number of memory means specified by the specifying signal. According to an embodiment of the present invention, it is possible to guarantee the data write processing speed and data read processing speed.

BRIEF DESCRIPTION OF THE DRAWINGS

FIG. 3 is a table showing contents of respective grades;

FIG. 5 is a schematic diagram showing the number of flash memory chips activated in each grade;

FIG. 14 is a sequence chart showing a data transfer rate setting process procedure (3).

DETAILED DESCRIPTION

An embodiment of the present invention will hereinafter be described in detail with reference to the drawings.

(1) First Embodiment

Figure 1:
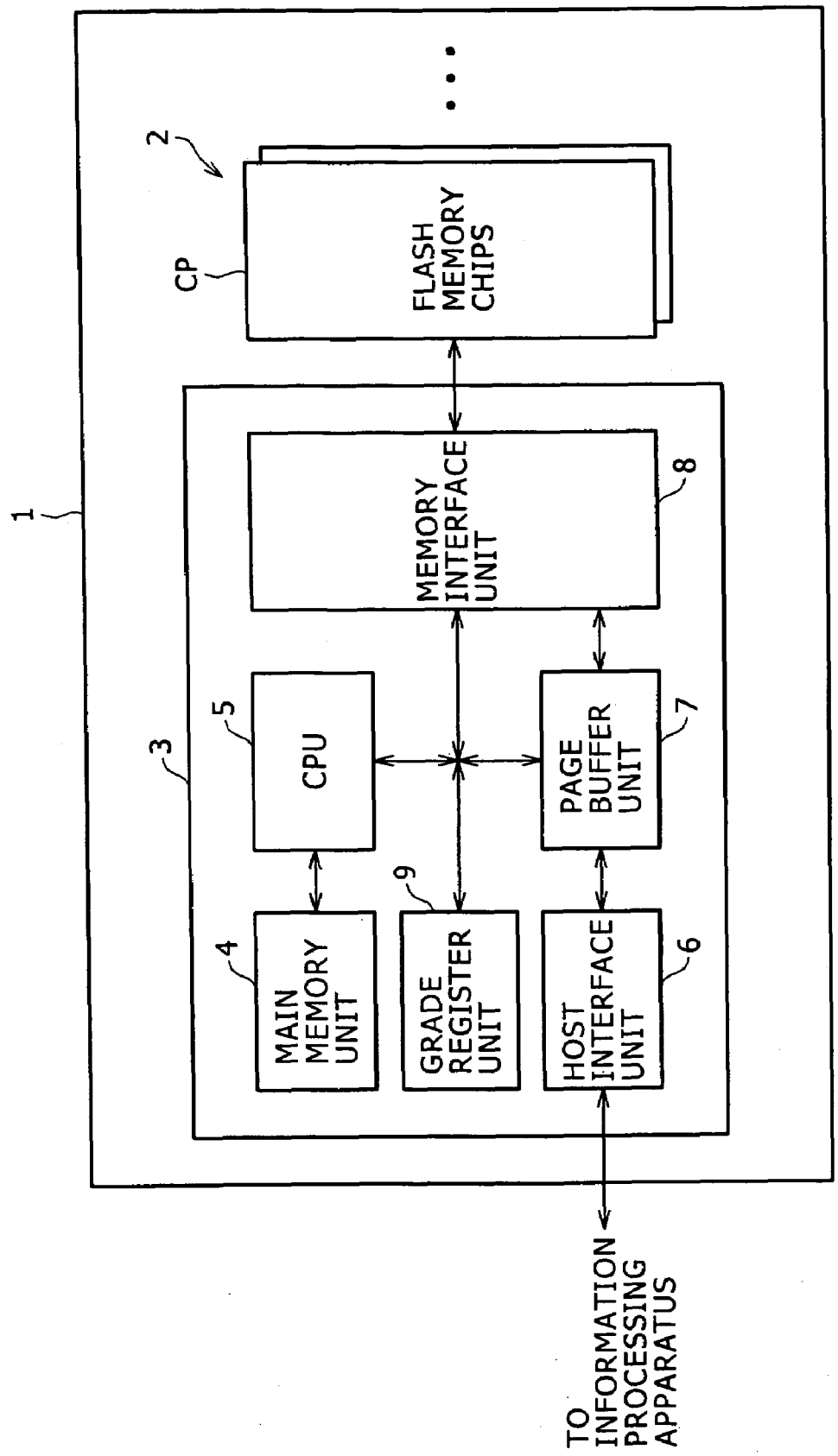
FIG. 1 is a schematic diagram showing a configuration of a semiconductor storage device according to a first embodiment.

Reference numeral 1 in FIG. 1 denotes a semiconductor storage device as a whole according to a first embodiment. The semiconductor storage device 1 has a connecting part (not explicitly shown in the figure) corresponding to a connector, for example. The semiconductor storage device 1 is connected to a PCI Express bus on an information processing apparatus side via the connecting part. The semiconductor storage device 1 thereby performs data communication with the information processing apparatus on the basis of a PCI Express system.

PCI Express is a standard developed and managed by PCI-SIG (PCI Special Interest Group). The semiconductor storage device 1 in the first embodiment is formed in the shape of a card in external appearance, and is similar in size/shape to a PC card, for example.

The semiconductor storage device 1 has a flash memory part 2 for storing data. The semiconductor storage device 1 also has a controller 3 for performing a data writing process for writing data from the information processing apparatus to which the semiconductor storage device 1 is connected via the connecting part to the flash memory part 2 and a data reading process for reading data requested by the information processing apparatus from the flash memory part 2.

Figure 2:
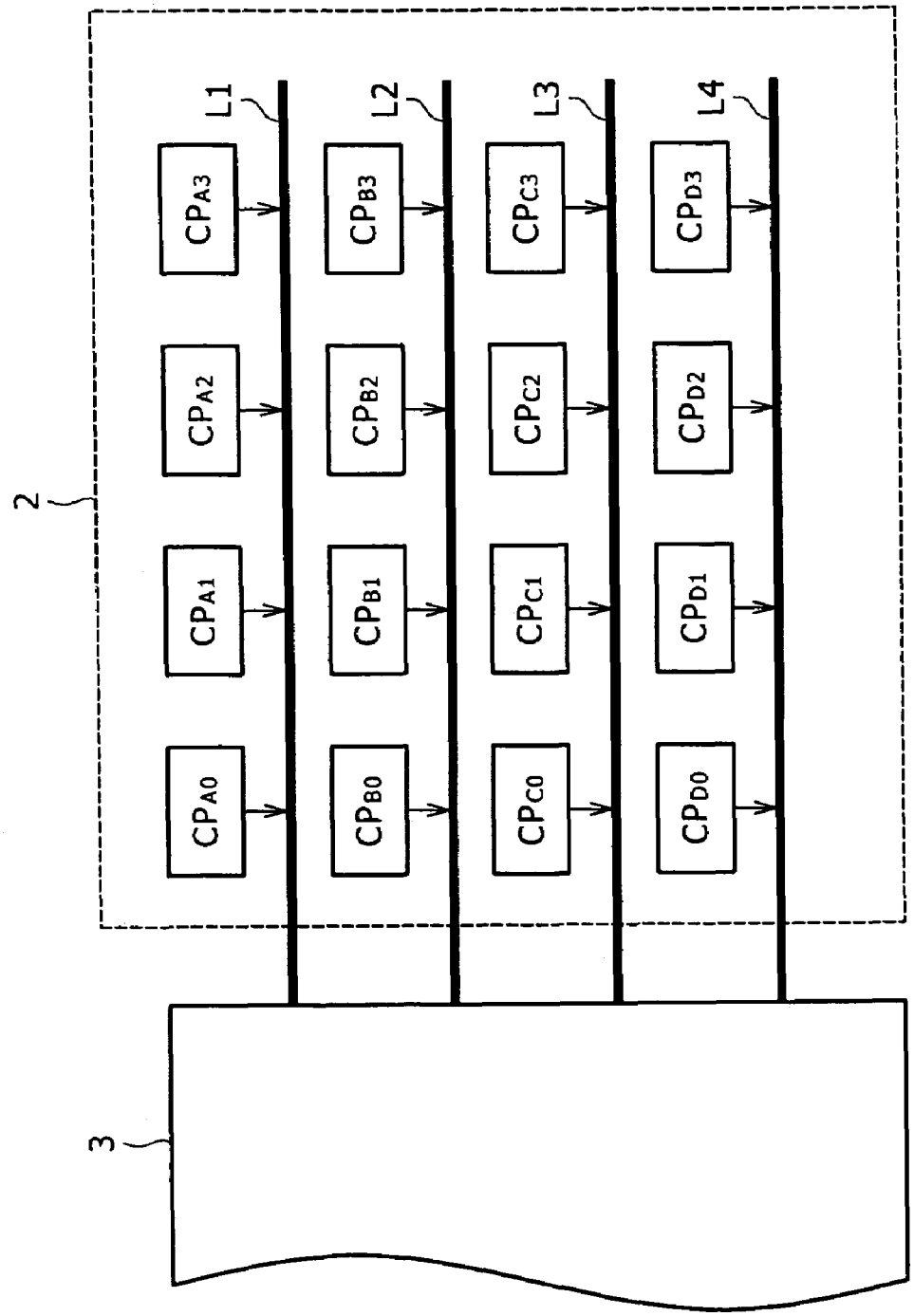
FIG. 2 is a schematic diagram showing a configuration of a flash memory part.

In actuality, the flash memory part 2 is formed by connecting a plurality of flash memory chips CP that store data. Specifically, as shown in FIG. 2, for example, the flash memory part 2 is formed by connecting a first to a fourth flash memory chip $CP_{A0\ to\ A3}$, a fifth to an eighth flash memory chip $CP_{B0\ to\ B3}$, a ninth to a twelfth flash memory chip $CP_{C0\ to\ C3}$, and a thirteenth to a sixteenth flash memory chip $CP_{D0\ to\ D3}$ to a first data transmission line L1, a second data transmission line L2, a third data transmission line L3, and a fourth data transmission line L4, respectively, the first data transmission line L1, the second data transmission line L2, the third data transmission line L3, and the fourth data transmission line L4 extending from the controller 3.

The controller 3 includes a CPU (Central Processing Unit) 5 for controlling the whole of the controller 3 according to firmware or the like stored in a main memory unit 4. The controller 3 also includes a host interface unit 6 for performing data communication with the information processing apparatus to which the semiconductor storage device 1 is connected via the connecting part on the basis of the PCI Express system.

When writing data to be written to the flash memory part 2 is transmitted from the information processing apparatus to which the semiconductor storage device 1 is connected via the connecting part, the semiconductor storage device 1 receives the transmitted writing data by the host interface unit 6.

The host interface unit 6 supplies the received writing data to a page buffer unit 7 provided within the controller 3.

The page buffer unit 7 temporarily stores the writing data from the host interface unit 6, and appropriately supplies the stored writing data to a memory interface unit 8 provided within the controller 3.

The memory interface unit 8 supplies the writing data from the page buffer unit 7 to the flash memory part 2.

Flash memory chips CP in the flash memory part 2 temporarily store the writing data from the memory interface unit 8 in a cache provided within the flash memory chips CP, and sequentially store the stored writing data in a storage area within the flash memory chips CP.

When the information processing apparatus to which the semiconductor storage device 1 is connected via the connecting part instructs the controller 3 of the semiconductor storage device 1 to read data stored in the flash memory part 2, the controller 3 reads the data from flash memory chips CP in the flash memory part 2, and then transmits the read data to the information processing apparatus on the basis of the PCI Express system.

Specifically, the memory interface unit 8 within the controller 3 receives the read data read from the flash memory part 2, and supplies the received read data to the page buffer unit 7.

The page buffer unit 7 temporarily stores the read data supplied from the memory interface unit 8, and appropriately supplies the stored read data to the host interface unit 6.

The host interface unit 6 transmits the read data from the page buffer unit 7 to the information processing apparatus on the basis of the PCI Express system.

Thus, the semiconductor storage device 1 can receive writing data transmitted from the information processing apparatus on the basis of the PCI Express system, and transmit read data read from the flash memory part 2 to the information processing apparatus on the basis of the PCI Express system.

A conventional semiconductor storage device of this type improves the speed of data communication with an information processing apparatus by employing for example a method of increasing the number of communication terminals for the data communication with the information processing apparatus or a method of increasing the frequency of a clock signal used in the data communication with the information processing apparatus. However, with an increase in the speed of the data communication, such conventional methods cannot avoid an increase in the number of communication terminals or effects of EMI (Electro-Magnetic Interference).

On the other hand, by applying PCI Express as a system for data communication with the information processing apparatus, the semiconductor storage device 1 according to the first embodiment can increase the speed of the data communication while avoiding an increase in the number of communication terminals or effects of EMI.

In addition to such a configuration, the controller 3 of the semiconductor storage device 1 has a grade register unit 9 for storing a value for specifying the rate of data transfer between the controller 3 and the flash memory part 2 (this value will hereinafter be referred to as a grade value).

The controller 3 interleaves flash memory chips CP corresponding in number to the grade value stored in the grade register unit 9. The controller 3 can thereby control the rate of data transfer between the controller 3 and the flash memory part 2 to a data transfer rate corresponding to the grade value.

In addition, the semiconductor storage device 1 guarantees a data write processing speed and a data read processing speed corresponding to the grade value stored in the grade register unit 9.

The grade value stored in the grade register unit 9 will first be described with reference to FIG. 3. There are three values "00," "01," and "10" as the grade value in the first embodiment.

In this case, the grade value "00" corresponds to grade 1. The grade value "01" corresponds to grade 2. Supposing that the number of flash memory chips CP interleaved in grade 1 is four, for example, the number of flash memory chips CP interleaved in grade 2 is set to eight. The grade value "10" corresponds to grade 3. The number of flash memory chips CP interleaved in grade 3 is set to 16.

Thus, supposing that a data transfer rate in grade 1 is "1," data transfer rates in grade 2 and grade 3 are "2" and "4." Supposing that a power consumption in grade 1 is "1," power consumptions in grade 2 and grade 3 are "1.5" and "3."

Interleave will next be described in detail. In interleave, a plurality of flash memory chips CP are activated simultaneously, and a data writing process and a data reading process are performed in parallel on the plurality of activated flash memory chips CP.

A comparison will be made in the following between a case where only the first flash memory chip $CP_{A0}$ is activated and a data writing process is performed and a case where the first and second flash memory chips $CP_{A0}$ and $CP_{A1}$ are activated simultaneously and a data writing process is performed in parallel.

Figures 4A, 4B:
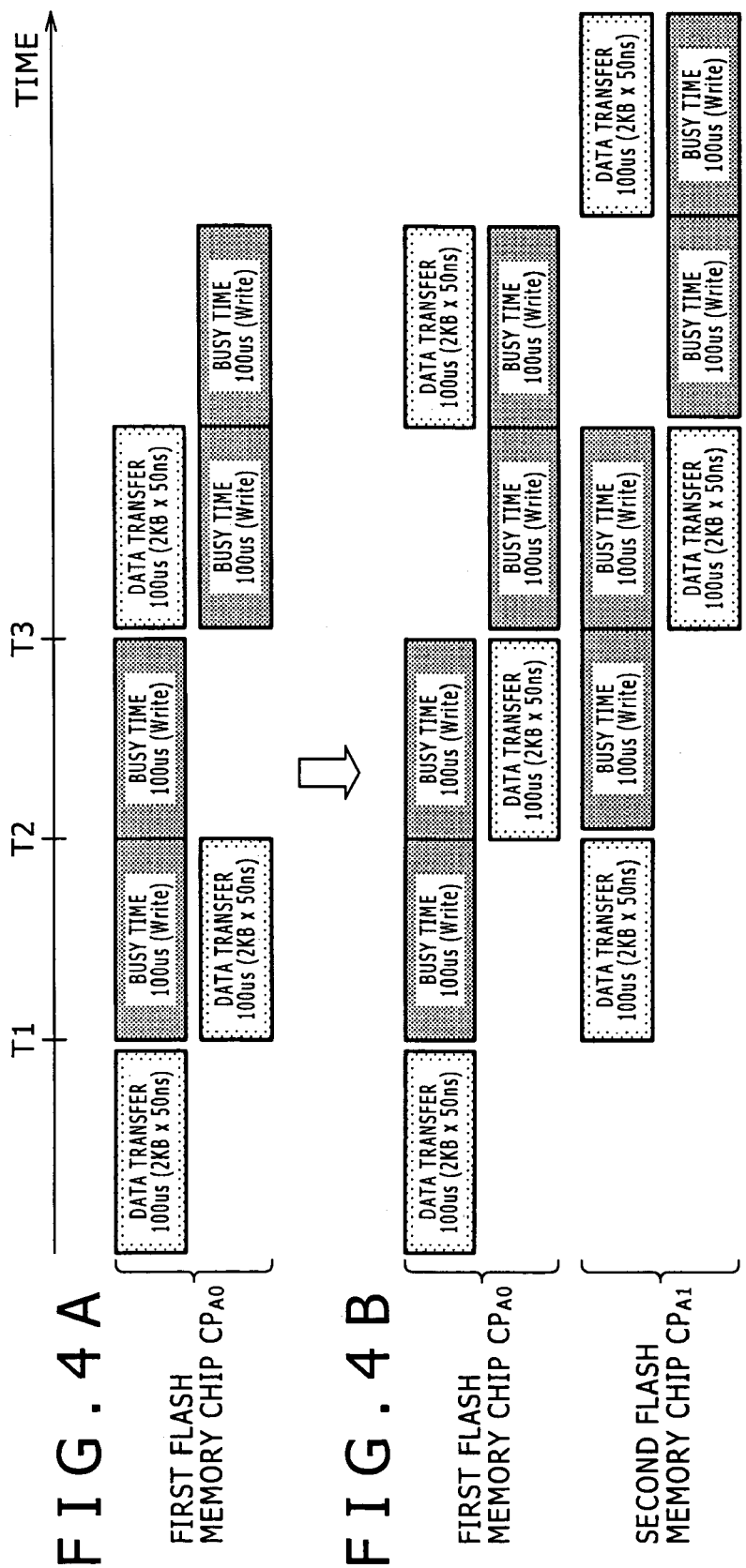
FIGS. 4A and 4B are schematic diagrams showing a state of memory interleave.

In the case where the controller 3 activates only the first flash memory chip $CP_{A0}$ and performs a data writing process, as shown in FIG. 4A, after a predetermined amount of writing data is transferred from the controller 3 to the first flash memory chip $CP_{A0}$, further writing data cannot be transferred during a busy time (T2-T3) excluding a time (T1-T2) during which the predetermined amount of writing data is concealed by the cache of the first flash memory chip $CP_{A0}$. Incidentally, a busy time in this case corresponds to a time taken to perform a process of storing writing data in the storage area of a flash memory chip CP and the like.

On the other hand, in the case where the controller 3 activates the first and second flash memory chips $CP_{A0}$ and $CP_{A1}$ and performs a data writing process in parallel, as shown in FIG. 4B, writing data can be sequentially transferred to these first and second flash memory chips $CP_{A0}$ and $CP_{A1}$. It is therefore possible to avoid a situation in which writing data cannot be transferred because of a busy time as illustrated in FIG. 4A, whereby the data transfer rate (data write processing speed) can be improved.

Thus, as shown in FIG. 5, the semiconductor storage device 1 according to the first embodiment can change the data transfer rate (data write processing speed/data read processing speed) for each grade by changing the number of flash memory chips CP activated for each grade.

Figure 6:
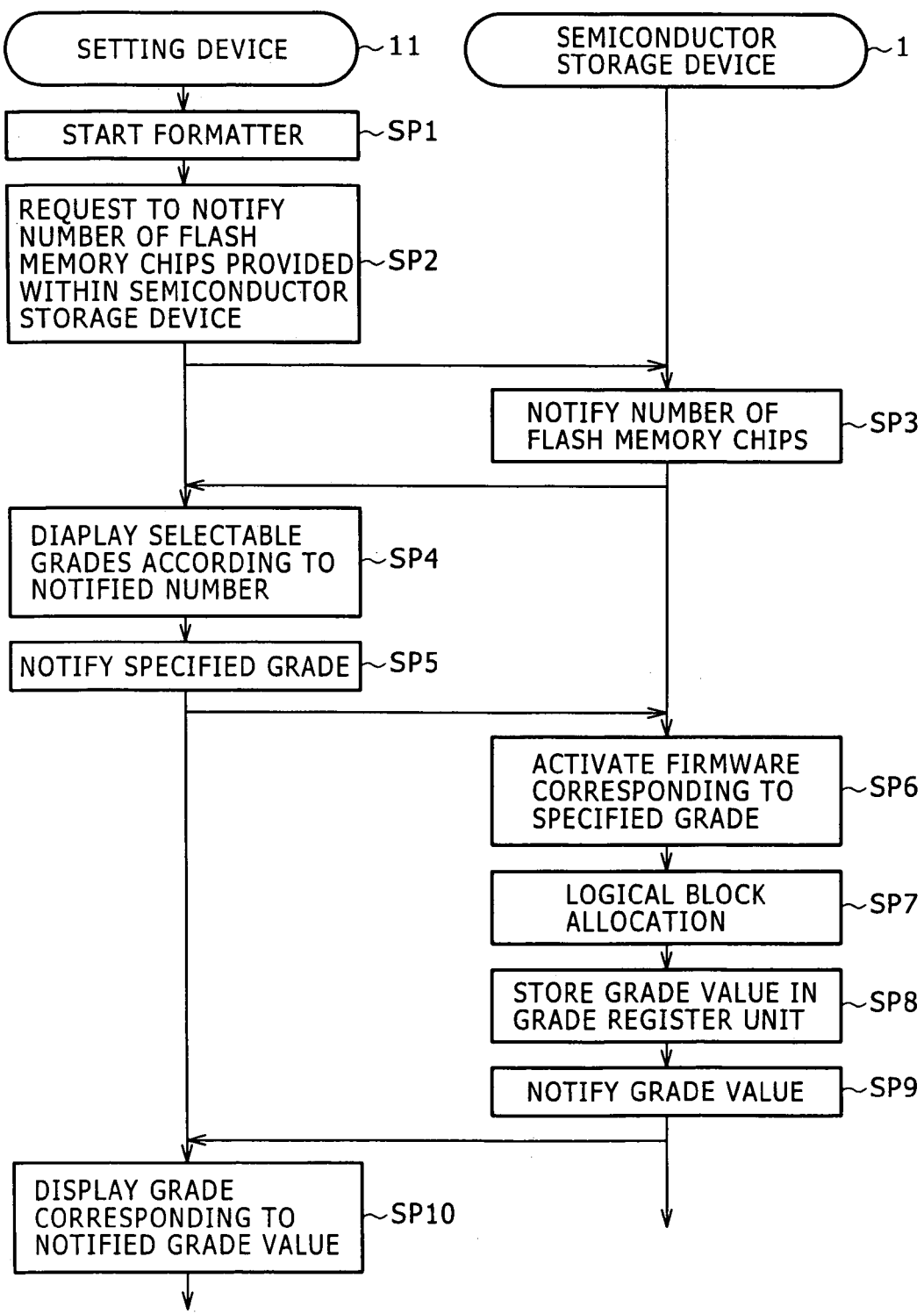
FIG. 6 is a sequence chart showing a data transfer rate setting process procedure (1)

A data transfer rate setting process procedure RT1 when the data transfer rate is set in for example a factory manufacturing the semiconductor storage device 1 (or when a user starts a formatter to format the semiconductor storage device 1) will next be described with reference to a sequence chart of FIG. 6.

When the semiconductor storage device 1 is connected to a setting device 11 configured so as to be able to perform data communication with the semiconductor storage device 1 on the basis of the PCI Express system, for example, the setting device 11 proceeds to step SP1, where the setting device 11 starts a formatter (program) for setting the rate of data transfer between the controller 3 and the flash memory part 2.

The setting device 11 next proceeds to step SP2, where the setting device 11 transmits a number notification request signal requesting a notification of the number of flash memory chips CP provided in the flash memory part 2 of the semiconductor storage device 1 to the semiconductor storage device 1 according to the formatter started in step SP1.

Receiving the number notification request signal, the controller 3 of the semiconductor storage device 1 proceeds to step SP3, where the controller 3 identifies the number of flash memory chips CP provided in the flash memory part 2 by accessing the flash memory part 2, and then transmits a number notification signal indicating the identified number of flash memory chips CP to the setting device 11.

Receiving the number notification signal, the setting device 11 proceeds to step SP4, where the setting device 11 displays grades that can be set according to the number of flash memory chips CP which number is indicated by the number notification signal on a display unit.

Specifically, when the number of flash memory chips CP which number is indicated by the number notification signal from the semiconductor storage device 1 is four, for example, this indicates that only grade 1 can be set as shown in FIG. 3, and therefore the setting device 11 displays only grade 1 as settable grade on the display unit. When the number of flash memory chips CP which number is indicated by the number notification signal from the semiconductor storage device 1 is eight, for example, this indicates that grade 1 and grade 2 can be set as shown in FIG. 3, and therefore the setting device 11 displays grade 1 and grade 2 as settable grades on the display unit. When the number of flash memory chips CP which number is indicated by the number notification signal from the semiconductor storage device 1 is 16, for example, this indicates that grade 1, grade 2, and grade 3 can be set as shown in FIG. 3, and therefore the setting device 11 displays grade 1, grade 2, and grade 3 as settable grades on the display unit.

In next step SP5, when a grade is specified from among the grades displayed on the display unit by the operation of an operator or the like, the setting device 11 transmits a grade specifying signal indicating the specified grade to the semiconductor storage device 1.

Receiving the grade specifying signal, the controller 3 of the semiconductor storage device 1 proceeds to step SP6, where the controller 3 activates firmware corresponding to the grade specified by the grade specifying signal among pieces of firmware stored in the main memory unit 4. In next step SP7, the controller 3 performs a logical block allocating process for performing logical block allocation for the specified grade.

Figure 7:
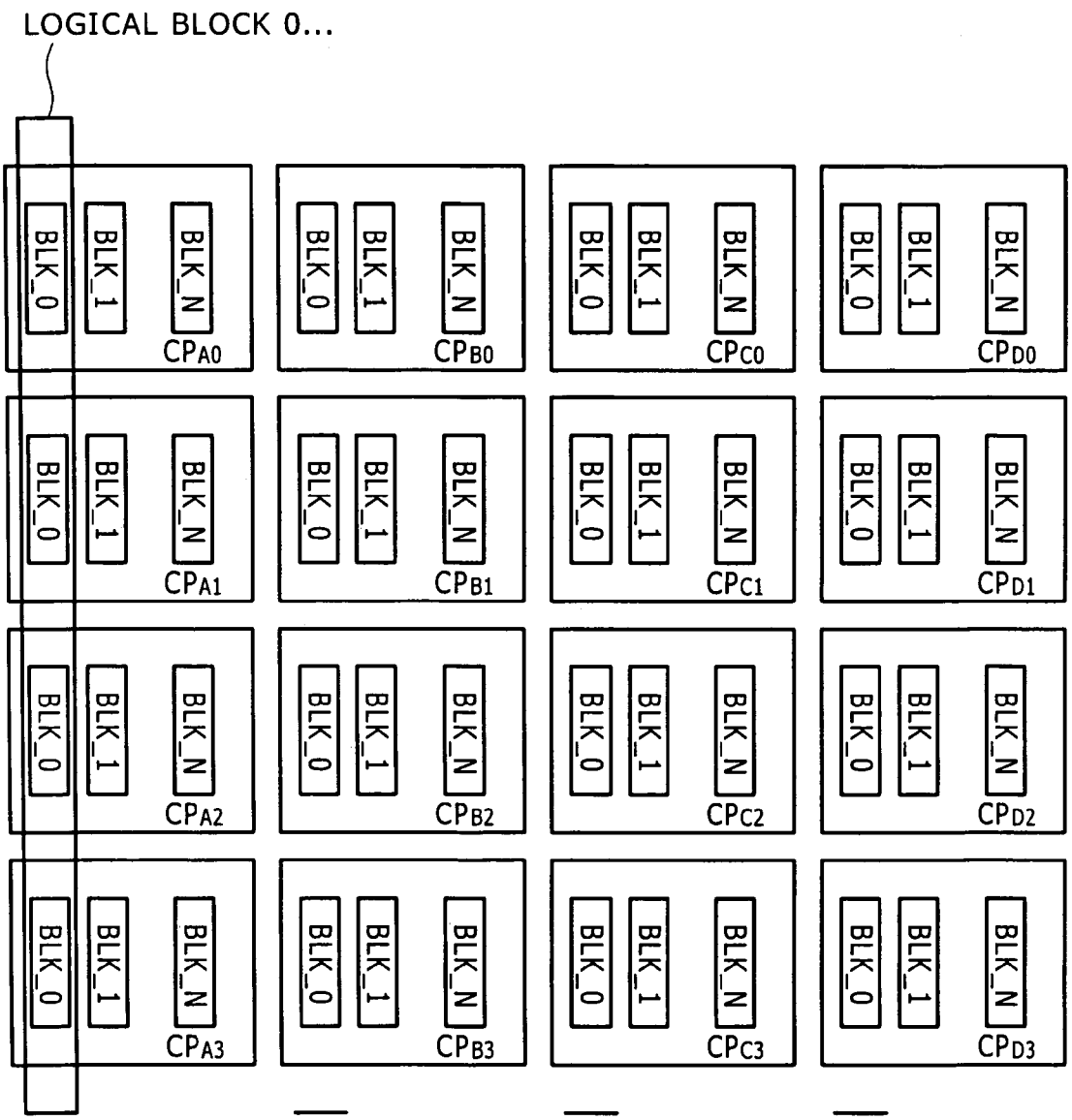
FIG. 7 is a schematic diagram showing logical block allocation in grade 1.

Specifically, in this logical block allocating process, when grade 1 is specified by the grade specifying signal from the setting device 11, a physical block of each of four flash memory chips CP is allocated as one logical block, as shown in FIG. 7 as an example. Thus, when the semiconductor storage device 1 is thereafter connected to an information processing apparatus such as a personal computer, a digital camera or the like, the controller 3 of the semiconductor storage device 1 performs a data writing process and a data reading process in the four flash memory chips CP in parallel.

Figure 8:
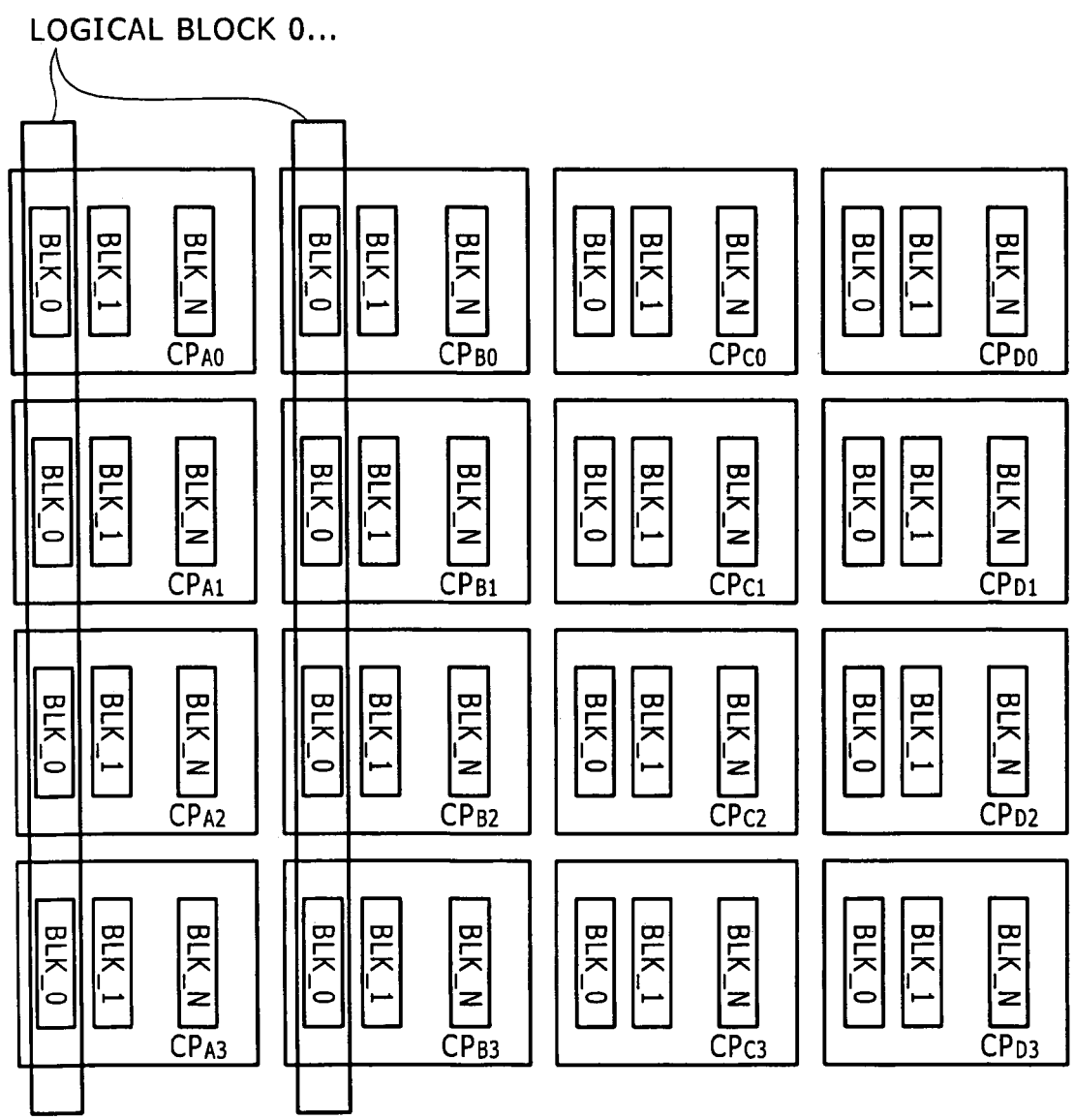
FIG. 8 is a schematic diagram showing logical block allocation in grade 2.

In this logical block allocating process, when grade 2 is specified by the grade specifying signal from the setting device 11, a physical block of each of eight flash memory chips CP is allocated as one logical block, as shown in FIG. 8 as an example. Thus, when the semiconductor storage device 1 is thereafter connected to an information processing apparatus such as a personal computer, a digital camera or the like, the controller 3 of the semiconductor storage device 1 performs a data writing process and a data reading process in the eight flash memory chips CP in parallel.

Figure 9:
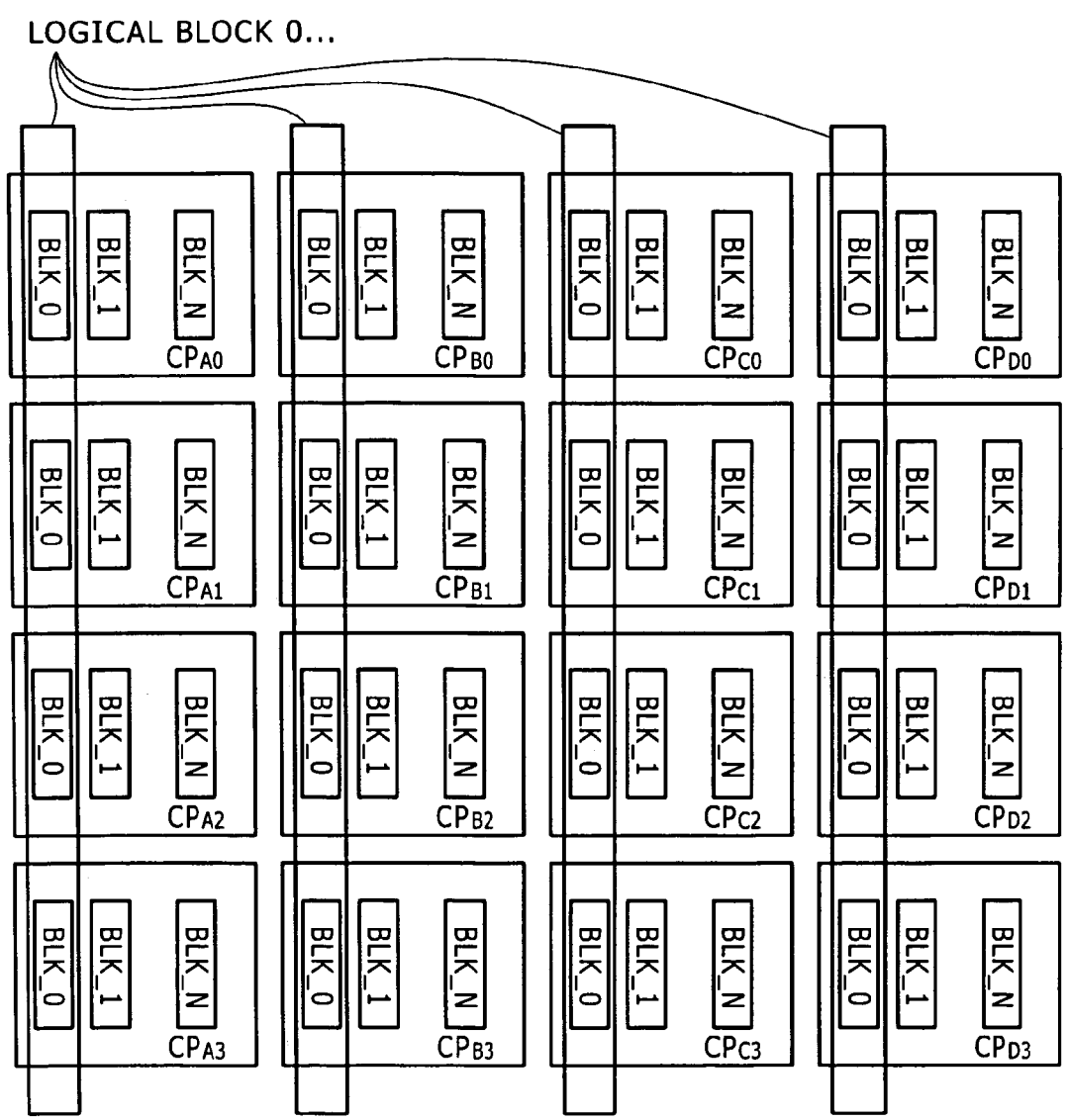
FIG. 9 is a schematic diagram showing logical block allocation in grade 3.

In this logical block allocating process, when grade 3 is specified by the grade specifying signal from the setting device 11, a physical block of each of 16 flash memory chips CP is allocated as one logical block, as shown in FIG. 9 as an example. Thus, when the semiconductor storage device 1 is thereafter connected to an information processing apparatus such as a personal computer, a digital camera or the like, the controller 3 of the semiconductor storage device 1 performs a data writing process and a data reading process in the 16 flash memory chips CP in parallel.

The controller 3 of the semiconductor storage device 1 then proceeds to next step SP8, where the controller 3 stores the grade value of the grade in which logical block allocation is successfully performed by the logical block allocating process in the grade register unit 9. Next, the controller 3 of the semiconductor storage device 1 proceeds to step SP9, where the controller 3 transmits a grade value notifying signal indicating the grade value of the grade in which logical block allocation is successfully performed by the logical block allocating process to the setting device 11.

Receiving the grade value notifying signal, the setting device 11 proceeds to step SP10, where the setting device 11 displays the grade corresponding to the grade value indicated by the grade value notifying signal on the display unit. The setting device 11 thereby notifies the operator that the grade is set in the semiconductor storage device 1.

In the above configuration, when receiving a grade specifying signal for specifying a grade from the setting device 11, the controller 3 of the semiconductor storage device 1 performs a logical block allocating process so that a data writing process and a data reading process can be performed in parallel in flash memory chips CP corresponding in number to the grade specified by the received grade specifying signal.

Thus, the semiconductor storage device 1 can change data write processing speed and data read processing speed according to the grade specified via the setting device 11.

(2) Second Embodiment

Figure 10:
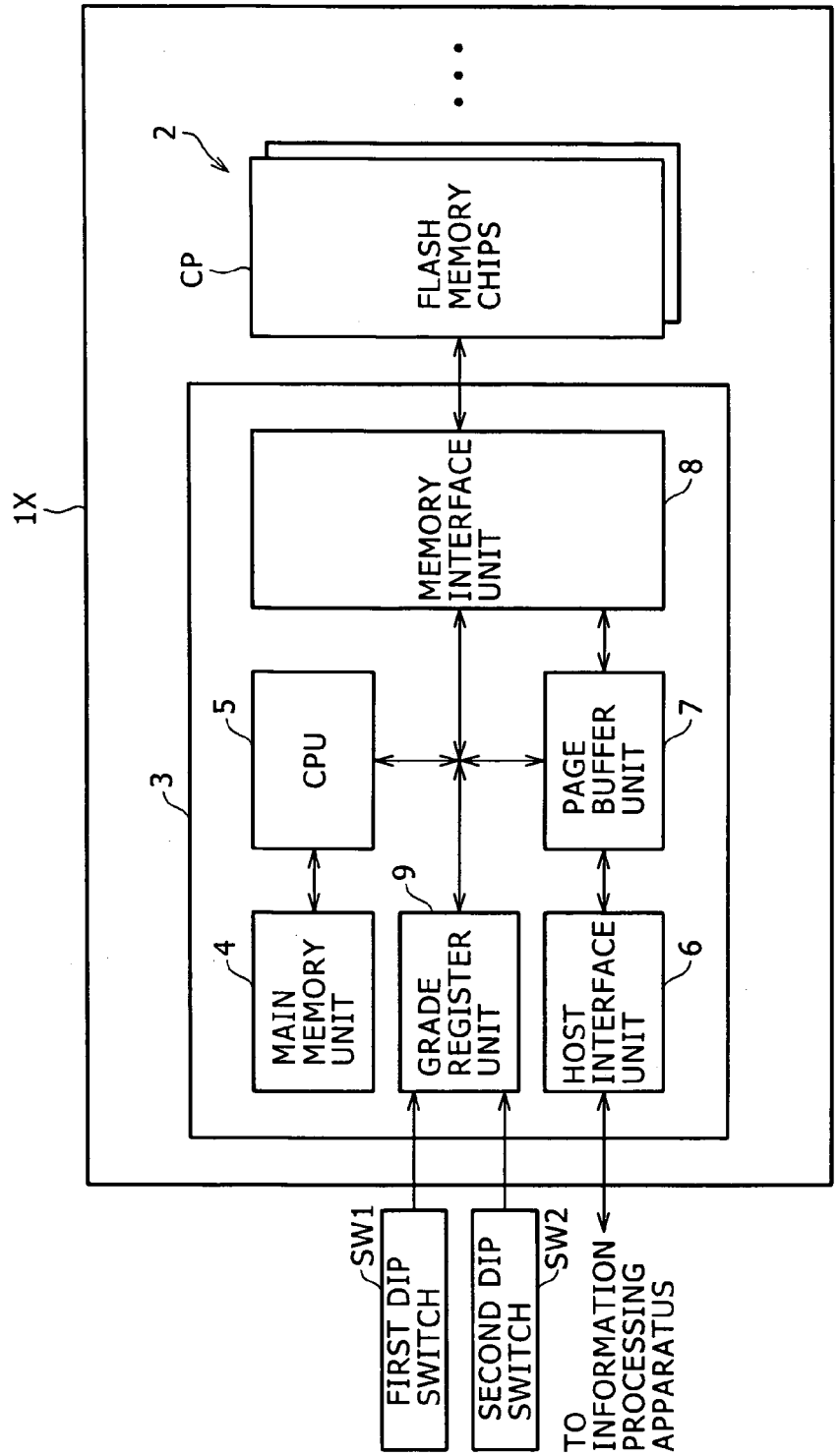
FIG. 10 is a schematic diagram showing a configuration of a semiconductor storage device according to a second embodiment.

Reference character 1X in FIG. 10, in which parts corresponding to those of FIG. 1 are identified by the same reference numerals, denotes a semiconductor storage device as a whole according to a second embodiment. The semiconductor storage device 1X according to the second embodiment has substantially the same configuration as the semiconductor storage device 1 according to the first embodiment except that the semiconductor storage device 1X according to the second embodiment has a first DIP switch SW1 and a second DIP switch SW2.

Figure 11A:
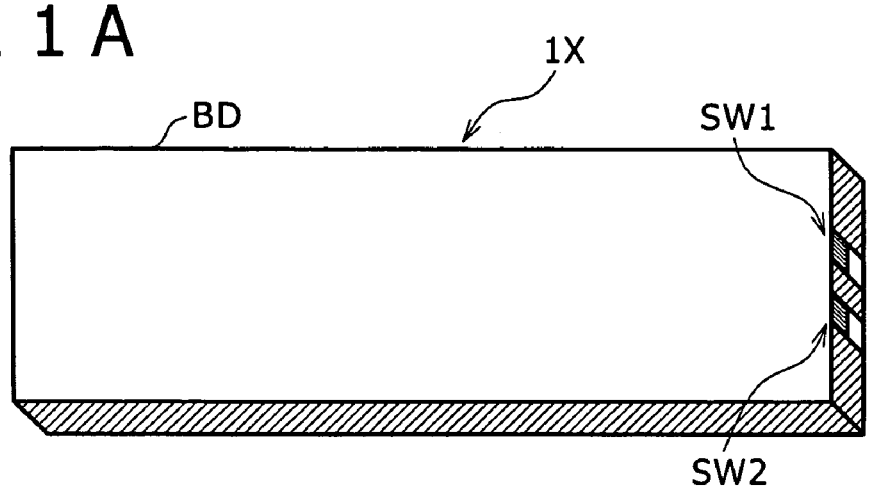
FIGS. 11A and 11B are schematic diagrams showing an external structure of the semiconductor storage device.
Figure 11B:
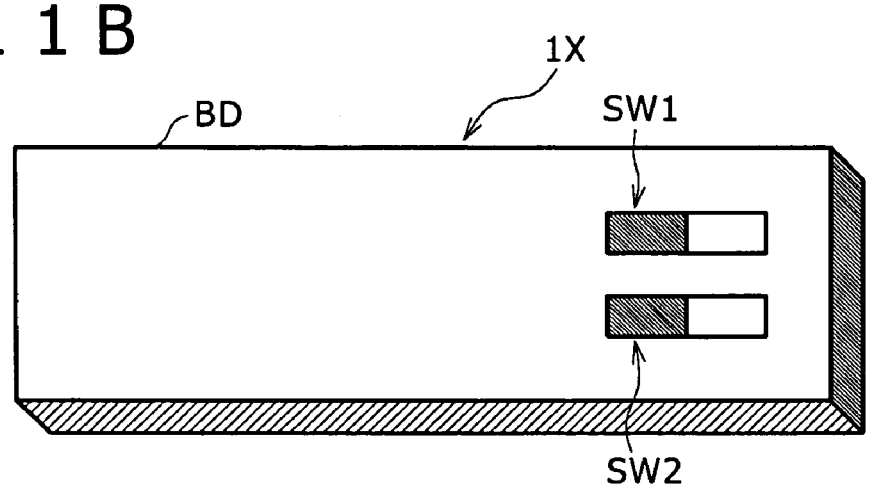

Specifically, the semiconductor storage device 1X according to the second embodiment has the first DIP switch SW1 and the second DIP switch SW2 in a side of a casing BD formed in a substantially rectangular shape having a predetermined thickness, as shown in FIG. 11A, for example. Incidentally, the first DIP switch SW1 and the second DIP switch SW2 may be provided in a top surface of the casing BD, as shown in FIG. 11B, for example.

Figure 12A:
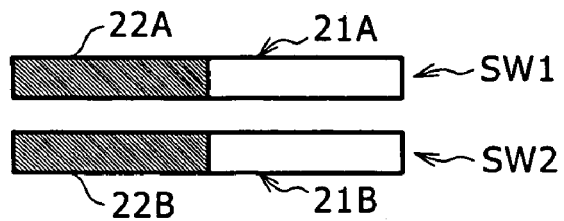
FIGS. 12A, 12B, and 12C are schematic diagrams showing a state of DIP switches.
Figure 12B:
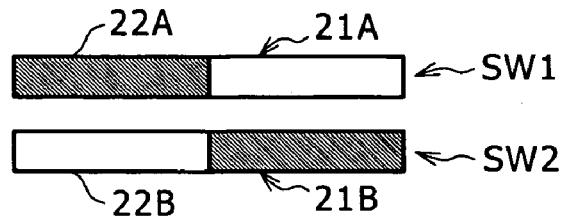
Figure 12C:
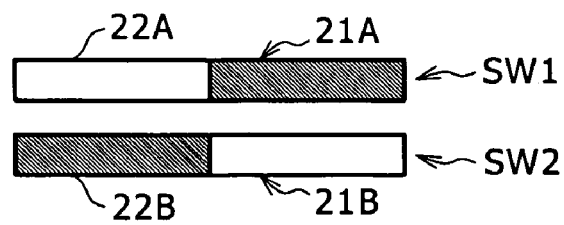

The first DIP switch SW1 and the second DIP switch SW2 are formed such that switch parts 22A and 22B are slid in a direction of one end or another end of slide grooves 21A and 21B formed in a substantially rectangular shape, as shown in FIGS. 12A, 12B, and 12C, for example.

In the second embodiment, when as shown in FIG. 12A, for example, the switch part 22A of the first DIP switch SW1 is slid to the one end side of the slide groove 21A, and the switch part 22B of the second DIP switch SW2 is slid to the one end side of the slide groove 21B, a grade value "00" indicating grade 1 is supplied from the first DIP switch SW1 and the second DIP switch SW2 to the controller 3 of the semiconductor storage device 1X.

In the second embodiment, when as shown in FIG. 12B, for example, the switch part 22A of the first DIP switch SW1 is slid to the one end side of the slide groove 21A, and the switch part 22B of the second DIP switch SW2 is slid to the other end side of the slide groove 21B, a grade value "01" indicating grade 2 is supplied from the first DIP switch SW1 and the second DIP switch SW2 to the controller 3 of the semiconductor storage device 1X.

In the second embodiment, when as shown in FIG. 12C, for example, the switch part 22A of the first DIP switch SW1 is slid to the other end side of the slide groove 21A, and the switch part 22B of the second DIP switch SW2 is slid to the one end side of the slide groove 21B, a grade value "10" indicating grade 3 is supplied from the first DIP switch SW1 and the second DIP switch SW2 to the controller 3 of the semiconductor storage device 1X.

Figure 13:
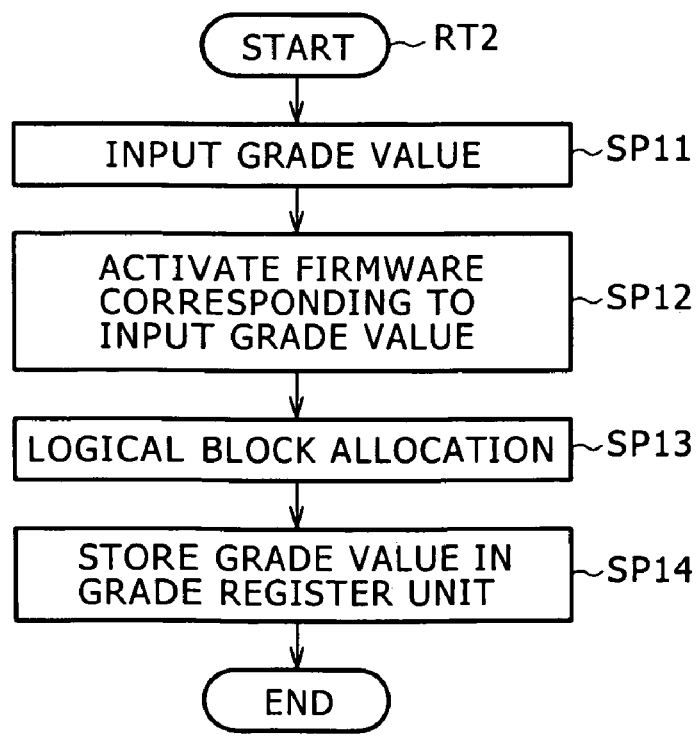
FIG. 13 is a flowchart showing a data transfer rate setting process procedure (2)

A data transfer rate setting process procedure RT2 when a data transfer rate is set via the first DIP switch SW1 and the second DIP switch SW2 will next be described with reference to a flowchart of FIG. 13.

In step SP11, when one of grade 1, grade 2, and grade 3 is specified by a user operating the first DIP switch SW1 and the second DIP switch SW2 provided in the casing BD of the semiconductor storage device 1X, in response to the specification, the first DIP switch SW1 and the second DIP switch SW2 input a grade value indicating the specified grade to the controller 3.

In response to this input, the controller 3 proceeds to step SP12, where the controller 3 activates firmware corresponding to the input grade value among pieces of firmware stored in a main memory unit 4. In next step SP13, the controller 3 performs a logical block allocating process for performing logical block allocation for the grade corresponding to the input grade value.

Specifically, in this logical block allocating process, when the input grade value is "00," which indicates grade 1, a physical block of each of four flash memory chips CP is allocated as one logical block, as shown in FIG. 7 as an example. In this logical block allocating process, when the input grade value is "01," which indicates grade 2, a physical block of each of eight flash memory chips CP is allocated as one logical block, as shown in FIG. 8 as an example. In this logical block allocating process, when the input grade value is "10," which indicates grade 3, a physical block of each of 16 flash memory chips CP is allocated as one logical block, as shown in FIG. 9 as an example.

The controller 3 of the semiconductor storage device 1X then proceeds to next step SP14, where the controller 3 stores the grade value of the grade in which logical block allocation is successfully performed by the logical block allocating process in a grade register unit 9.

In the above configuration, when receiving a grade value for specifying a grade from the first DIP switch SW1 and the second DIP switch SW2, the controller 3 of the semiconductor storage device 1X performs a logical block allocating process so that a data writing process and a data reading process can be performed in parallel in flash memory chips CP corresponding in number to the received grade value.

Thus, the semiconductor storage device 1X can change data write processing speed and data read processing speed according to the grade specified via the first DIP switch SW1 and the second DIP switch SW2.

(3) Third Embodiment

A semiconductor storage device 1 according to a third embodiment has the same configuration as the semiconductor storage device 1 according to the first embodiment shown in FIG. 1. Therefore, description in the following will be made centering on a data transfer rate setting process procedure RT3 when a rate of data transfer between a controller 3 and a flash memory part 2 is set with reference to a sequence chart of FIG. 14.

When the controller 3 of the semiconductor storage device 1 starts to be supplied with power from an information processing apparatus 31 by being connected to the information processing apparatus 31 corresponding to a personal computer, a digital camera or the like, the controller 3 proceeds to step SP21, where the controller 3 identifies the number of flash memory chips CP provided in the flash memory part 2 by accessing the flash memory part 2.

Incidentally, in the third embodiment, the controller 3 of the semiconductor storage device 1 sets the rate of data transfer between the controller 3 and the flash memory part 2 to grade 1 as an initial setting when the controller 3 starts to be supplied with power from the information processing apparatus 31 to which the controller 3 is connected.

Next, the controller 3 of the semiconductor storage device 1 proceeds to step SP22, where the controller 3 identifies settable grades on the basis of the number of flash memory chips CP which number is identified in step SP21. Specifically, when the number of flash memory chips CP which number is identified in step SP21 is four, for example, the controller 3 identifies only grade 1 as settable grade. When the number of flash memory chips CP which number is identified in step SP21 is eight, for example, the controller 3 identifies grade 1 and grade 2 as settable grades. When the number of flash memory chips CP which number is identified in step SP21 is 16, for example, the controller 3 identifies grade 1, grade 2, and grade 3 as settable grades. The controller 3 then stores settable grade information indicating the identified settable grades and present grade information indicating the grade value "00" of the currently set grade (that is, grade 1) in a grade register unit 9.

Meanwhile, the information processing apparatus 31 in step S23 reads predetermined attribute information from the semiconductor storage device 1 with which the information processing apparatus 31 is connected, and recognizes that the semiconductor storage device 1 is connected to the information processing apparatus 31 on the basis of the read attribute information.

The controller 3 of the semiconductor storage device 1 proceeds to step SP24, where the controller 3 transmits the settable grade information and the present grade information stored in the grade register unit 9 to the information processing apparatus 31.

Receiving the settable grade information and the present grade information from the semiconductor storage device 1, the information processing apparatus 31 proceeds to step SP25, where the information processing apparatus 31 determines whether grade 1 indicated by the present grade information suits a process (application) currently being performed in the information processing apparatus 31. When the process currently being performed is a process of storing a large amount of data in the semiconductor storage device 1, the information processing apparatus 31 determines that grade 1 indicated by the present grade information is not suitable. When the information processing apparatus 31 thus determines that grade 1 indicated by the present grade information is not suitable, the information processing apparatus 31 selects for example grade 3 suiting the process currently being performed from the settable grades indicated by the settable grade information received from the semiconductor storage device 1. The information processing apparatus 31 transmits a grade specifying signal specifying the selected grade 3 to the semiconductor storage device 1.

Receiving the grade specifying signal, the controller 3 of the semiconductor storage device 1 proceeds to step SP26, where the controller 3 activates firmware corresponding to grade 3 specified by the grade specifying signal among pieces of firmware stored in a main memory unit 4. In next step SP27, the controller 3 performs a logical block allocating process for performing logical block allocation for grade 3.

Specifically, in this logical block allocating process, a physical block of each of 16 flash memory chips CP is allocated as one logical block, as shown in FIG. 9 as an example.

The controller 3 of the semiconductor storage device 1 then proceeds to next step SP28, where the controller 3 stores the grade value "10" of grade 3 in which logical block allocation is successfully performed by the logical block allocating process as present grade information in the grade register unit 9. Next, the controller 3 of the semiconductor storage device 1 proceeds to step SP29, where the controller 3 transmits a setting completion notifying signal for notifying that the setting of grade 3 is completed to the information processing apparatus 31.

Receiving this setting completion notifying signal, the information processing apparatus 31 proceeds to step SP30, where the information processing apparatus 31 performs data communication with the semiconductor storage device 1 in grade 3 notified by the setting completion notifying signal.

In the above configuration, the information processing apparatus 31 with which the semiconductor storage device 1 is connected transmits a grade specifying signal for specifying a grade according to a type of process (application) currently being performed in the information processing apparatus 31 to the semiconductor storage device 1.

Receiving the grade specifying signal from the information processing apparatus 31, the controller 3 of the semiconductor storage device 1 performs a logical block allocating process so that a data writing process and a data reading process can be performed in parallel in flash memory chips CP corresponding in number to the grade specified by the received grade specifying signal.

Thus, the semiconductor storage device 1 can change data write processing speed and data read processing speed according to a process performed in the information processing apparatus 31 to which the semiconductor storage device 1 is connected.

While in the third embodiment, the semiconductor storage device 1 changes the data write processing speed and the data read processing speed according to a process performed in the information processing apparatus 31 to which the semiconductor storage device 1 is connected, the present invention is not limited to this. The semiconductor storage device 1 may change the data write processing speed and the data read processing speed according to a condition of power supply of the information processing apparatus 31 to which the semiconductor storage device 1 is connected.

Specifically, in this case, when the information processing apparatus 31 to which the semiconductor storage device 1 is connected operates on power supplied from a battery provided within the information processing apparatus 31, for example, the semiconductor storage device 1 decreases the data write processing speed and the data read processing speed, thereby making it possible to avoid a sharp decrease in an amount of charge of the battery. When the information processing apparatus 31 to which the semiconductor storage device 1 is connected operates on power supplied from a commercial power supply, for example, the semiconductor storage device 1 increases the data write processing speed and the data read processing speed, thereby making it possible to shorten the processing time of data write processing and data read processing.

(4) Other Embodiments

It is to be noted that while in the foregoing first to third embodiments, description has been made of a case where the number of flash memory chips CP provided in the semiconductor storage device 1 is 16, the present invention is not limited to this. The number of flash memory chips CP provided in the semiconductor storage device 1 may be larger than 16 or smaller than 16 as long as there are a plurality of flash memory chips CP.

Incidentally, in the foregoing first to third embodiments, description has been made of a case where 16 flash memory chips CP are provided for the semiconductor storage device 1 to realize three grades, that is, grade 1, grade 2, and grade 3. However, when only four flash memory chips CP are provided in the semiconductor storage device 1 to realize only grade 1, the first DIP switch SW1 and the second DIP switch SW2 described above do not need to be provided for the semiconductor storage device 1. Alternatively, a register for storing data indicating a settable grade (that is, grade 1) may be provided within the controller 3 of the semiconductor storage device 1 so that the controller 3 of the semiconductor storage device 1 disables the setting of grades (grade 2 and grade 3) other than the settable grade on the basis of the data stored in the register.

When only eight flash memory chips CP are provided in the semiconductor storage device 1 to realize only grade 1 and grade 2, only one DIP switch SW may be provided for the semiconductor storage device 1 to enable only switching between grade 1 and grade 2. Alternatively, a register for storing data indicating settable grades (that is, grade 1 and grade 2) may be provided within the controller 3 of the semiconductor storage device 1 so that the controller 3 of the semiconductor storage device 1 disables the setting of a grade (grade 3) other than the settable grades on the basis of the data stored in the register.

In addition, while in the foregoing first to third embodiments, description has been made of a case where flash memory chips CP are applied as a plurality of memory means for storing data, the present invention is not limited to this. Various other semiconductor memories and other memories can be applied.

Further, while in the foregoing first to third embodiments, description has been made of a case where the controller 3 shown in FIG. 1 and the like is applied as control means for controlling the memory means, the present invention is not limited to this. Various other constitutions can be applied.

Further, while in the foregoing first to third embodiments, description has been made of a case where the data write processing speed and the data read processing speed are guaranteed by activating a minimum of four flash memory chips CP in grade 1 in which the data write processing speed and the data read processing speed are lowest, the present invention is not limited to this. Various other methods can be applied.

The present invention is applicable to for example a semiconductor storage device that stores data supplied from an information processing apparatus such as a personal computer, a digital camera or the like in an internal semiconductor memory.

It should be understood by those skilled in the art that various modifications, combinations, sub-combinations and alterations may occur depending on design requirements and other factors insofar as they are within the scope of the appended claims or the equivalents thereof.

The invention claimed is:

1. A storage device, comprising:
a plurality of memory means for storing data;
control means for controlling a number of the plurality of memory means in parallel to perform one of a data writing process for writing data supplied from a connection destination device to which the storage device is connected and a data reading process for reading data requested by the connection destination device; and
a grade register for storing a grade value for use by the control means in determining a data transfer rate for reading data from and writing data to the storage device by specifying the number of memory means to be used in parallel to store the data, and thereby determining a power consumption of the storage device.

2. The storage device as claimed in claim 1, further comprising data communication means for performing data communication with the connection destination device based on a PCI Express system.

3. A storage device, comprising:
a plurality of memory means for storing data; and
control means for controlling the memory means; and
a grade register for storing a grade value for use by the control means in determining a data transfer rate for reading data from and writing data to the storage device by specifying a number of the plurality of memory means to be interleaved in storing the data, and thereby determining a power consumption of the storage device;
wherein one of a minimum write speed of a data write process for writing data supplied from a connection destination device to which the storage device is connected and a minimum read speed of a data read process for reading data requested by the connection destination device is guaranteed.

4. A storage device, comprising:
a plurality of memories for storing data;
a controller for controlling a number of the plurality of memories in parallel, to perform one of a data writing process for writing data supplied from a connection destination device to which the storage device is connected and a data reading process for reading data requested by the connection destination device; and
a grade register for storing a grade value for use by the controller in determining a data transfer rate for reading data from and writing data to the storage device by specifying the number of memories to be used in parallel to store the data, thereby determining a power consumption of the storage device.

5. A storage device, comprising:
a plurality of memories for storing data;
a controller for controlling the memories; and a grade register for storing a grade value for use by the controller in determining a data transfer rate for reading data from and writing data to the storage device by specifying a number of the plurality of memories to be interleaved in storing the data, thereby determining a power consumption of the storage device;

wherein one of a minimum write speed of a data write process for writing data supplied from a connection destination device to which the storage device is connected and a minimum read speed of a data read process for reading data requested by the connection destination device is guaranteed.

6. An information processing device, comprising:

a plurality of memory means for storing data;

control means for controlling a number of the plurality of memory means in parallel to perform one of a data writing process for writing data supplied from a connection destination device to which the information processing device is connected and a data reading process for reading data requested by the connection destination device; and a grade register for storing a grade value for use by the control means in determining a data transfer rate for reading data from and writing data to the information processing device by specifying the number of memory means to be used in parallel to store the data, and thereby determining a power consumption of the information processing device.

7. An information processing device, comprising:

a plurality of memory means for storing data; and control means for controlling the memory means; and a grade register for storing a grade value for use by the control means in determining a data transfer rate for reading data from and writing data to the information processing device by specifying a number of the plurality of memory means to be interleaved in storing the data, and thereby determining a power consumption of the information processing device;

wherein one of a minimum write speed of a data write process for writing data supplied from a connection destination device to which the storage device is connected and a minimum read speed of a data read process for reading data requested by the connection destination device is guaranteed.

8. An information processing device, comprising:

a plurality of memories for storing data;

a controller for controlling a number of the plurality of memories in parallel, to perform one of a data writing process for writing data supplied from a connection destination device to which the information processing device is connected and a data reading process for reading data requested by the connection destination device; and a grade register for storing a grade value for use by the controller in determining a data transfer rate for reading data from and writing data to the information processing device by specifying the number of memories to be used in parallel to store the data, thereby determining a power consumption of the information processing device.

9. An information processing device, comprising:

a plurality of memories for storing data;

a controller for controlling the memories; and a grade register for storing a grade value for use by the controller in determining a data transfer rate for reading data from and writing data to the information processing device by specifying a number of the plurality of memories to be interleaved in storing the data, thereby determining a power consumption of the information processing device;

wherein one of a minimum write speed of a data write process for writing data supplied from a connection destination device to which the information processing device is connected and a minimum read speed of a data read process for reading data requested by the connection destination device is guaranteed.

* * * * *